US012139785B2

(12) United States Patent
Kwon

(10) Patent No.: US 12,139,785 B2
(45) Date of Patent: Nov. 12, 2024

(54) METHOD FOR FORMING COATING LAYER HAVING PLASMA RESISTANCE

(71) Applicant: Soon Young Kwon, Cheonan-si (KR)

(72) Inventor: Soon Young Kwon, Cheonan-si (KR)

( * ) Notice: Subject to any disclaimer, the term of this patent is extended or adjusted under 35 U.S.C. 154(b) by 312 days.

(21) Appl. No.: 17/771,550

(22) PCT Filed: Oct. 20, 2020

(86) PCT No.: PCT/KR2020/014306
§ 371 (c)(1),
(2) Date: Apr. 25, 2022

(87) PCT Pub. No.: WO2021/080281
PCT Pub. Date: Apr. 29, 2021

(65) Prior Publication Data
US 2022/0364221 A1 Nov. 17, 2022

(30) Foreign Application Priority Data

Oct. 24, 2019 (KR) .................. 10-2019-0133101
Oct. 13, 2020 (KR) .................. 10-2020-0131792

(51) Int. Cl.
C23C 14/30 (2006.01)
C23C 14/08 (2006.01)
H01J 37/32 (2006.01)

(52) U.S. Cl.
CPC .............. *C23C 14/30* (2013.01); *C23C 14/08* (2013.01); *H01J 37/32174* (2013.01)

(58) Field of Classification Search
CPC ..... C23C 14/08; C23C 14/30; H01J 37/32174
(Continued)

(56) References Cited

U.S. PATENT DOCUMENTS 6,066,399 A * 5/2000 Hirano .................. C23C 16/029
427/249.1
9,970,095 B2 * 5/2018 Sun ........................ C23C 14/542
(Continued)

FOREIGN PATENT DOCUMENTS

JP H06-158270 A 6/1994
JP 2008-144192 A 6/2008
(Continued)

*Primary Examiner* — Brian K Talbot
(74) *Attorney, Agent, or Firm* — KORUS Patent, LLC; Seong Il Jeong

(57) ABSTRACT

The present invention relates to a method of forming a coating layer having plasma resistance, the method comprising steps of: preparing a substrate by placing the substrate in a substrate fixing device inside a process chamber; evaporating a $Y_2O_3$ deposition material provided in a solid form in an electron beam source by irradiating an electron beam on the $Y_2O_3$ deposition material; generating radical particles having activation energy by injecting a process gas containing oxygen for forming radicals into a RF energy beam source; irradiating an RF energy beam including the radical particles generated in the RF energy beam source, toward the substrate; depositing a thin film in which the evaporated deposition material is deposited on the substrate by being assisted by the RF energy beam, and densifying the thin film in which the deposition material deposited on the substrate forms a densified film by ion bombardment of the RF energy beam.

4 Claims, 7 Drawing Sheets

(58) Field of Classification Search
USPC .......................................................... 427/566
See application file for complete search history.

(56) References Cited

U.S. PATENT DOCUMENTS

| | | | |
|---|---|---|---|
| 11,195,695 B2* | 12/2021 | Jelinek | ................ H01L 21/2654 |
| 11,834,204 B1* | 12/2023 | Gorokhovsky | ....... F03H 1/0043 |
| 2004/0134429 A1* | 7/2004 | Yamanaka | ........ H01L 21/02658 |
| | | | 257/E21.101 |
| 2007/0045534 A1* | 3/2007 | Zani | ....................... B82Y 40/00 |
| | | | 257/E21.336 |
| 2011/0151247 A1* | 6/2011 | Shiono | .................. C23C 14/541 |
| | | | 427/532 |
| 2012/0125764 A1* | 5/2012 | Fukushima | ......... C23C 14/0052 |
| | | | 204/192.11 |
| 2013/0164454 A1* | 6/2013 | Pitcher | .................... C23C 14/48 |
| | | | 427/523 |
| 2016/0289819 A1* | 10/2016 | Lyngnes | ............. C23C 14/3442 |
| 2018/0358213 A1* | 12/2018 | Ruzic | ....................... H03K 3/02 |

FOREIGN PATENT DOCUMENTS

| | | |
|---|---|---|
| KR | 10-2005-0042765 A | 5/2005 |
| KR | 10-2009-0045382 A | 5/2009 |
| KR | 10-1183021 B1 | 9/2012 |
| KR | 10-2019-0022054 A | 3/2019 |
| WO | 99/46421 A | 9/1999 |

* cited by examiner

METHOD FOR FORMING COATING LAYER HAVING PLASMA RESISTANCE

FIELD OF THE INVENTION

The present invention relates to a method of forming a coating layer having plasma resistance, and more particularly, to a method of forming a coating layer having plasma resistance that generates oxygen and argon radicals having high activation energy by using an RF energy beam source capable of generating high-density plasma, irradiates it to a substrate, and deposits a dense coating layer with no micropores therein using high energy ion bombardment by the RF energy beam source, thereby allowing minimizing physical etching by physical sputtering, minimizing micropores inside the coating layer to minimize a contact area with chemical etching gas, and minimizing chemical etching and generation of particles.

BACKGROUND OF THE INVENTION

A ceramic material having a high melting point and excellent durability is applied to members used in a plasma environment of semiconductor device and display processes, such as a dielectric window, a shower head, an electrostatic chuck, a heater, a chamber liner, and a boat, a focus ring, and a wall liner for a chemical vapor deposition (CVD). However, according to demand for high integration of a semiconductor device, density of plasma used in semiconductor manufacturing facilities is increasing, and thus, there is an emerging need for development of a ceramic material with excellent plasma etch resistance and less pollutant particles.

Quartz ($SiO_2$) or alumina ($Al_2O_3$) is mainly used as a conventional ceramic material, but there are limitations in that it has process defects caused by particle fall-out and a short lifespan caused by low plasma resistance.

Recently, yttrium oxide ($Y_2O_3$), also referred to as 'Yttria,' or rare earth ceramic materials, which has excellent etch resistance, have been used. Based on factors such as production convenience and high price, yttrium oxide or a rare earth based material is coated on a quartz or alumina substrate and used as a plasma resistant member.

As a conventional method of forming a coating film, a plasma spraying method, which forms a coating film by spraying of powder using high-temperature plasma, has been used. However, the ceramic coating film formed by this method has a high porosity and a rough surface due to a unique multilayer microstructure formed by the spraying method. Accordingly, the lifespan of the coating layer is shortened in that the high porosity allows reactive gases generated in plasma environment to penetrate into the ceramic coating film through pores and to promote reaction, and the rough surface allows selective etching by particles accelerated in the plasma.

Meanwhile, Korean Patent Registration No. 10-1183021 (Patent Document 1) discloses a method of forming a coating layer using electron beam evaporation.

The coating layer formed by the electron beam evaporation method has relatively superior purity of a coating layer compared to a coating layer formed by the plasma spraying method and thus has excellent plasma resistance and sufficiently low surface roughness. However, since the coating layer formed by the electron beam evaporation method also has a columnar structure and has a large number of pores therein, it can be easily destroyed in a high density plasma etching process, and thus, there are problems such as poor durability and a short lifespan.

DETAILED DESCRIPTION OF THE INVENTION

Technical Problems

Accordingly, an object of the present invention is to solve the problems described above and to provide a method of forming a coating layer having plasma resistance that generates oxygen and argon radicals having high activation energy by using an RF energy beam source capable of generating high-density plasma, irradiates it to a substrate, and deposits a dense coating layer with no micropores therein using high energy ion bombardment by the RF energy beam source, thereby allowing minimizing physical etching by physical sputtering, minimizing micropores inside the coating layer to minimize a contact area with chemical etching gas, and minimizing chemical etching and generation of particles.

SUMMARY OF THE INVENTION

Accordingly, the object of the present invention is achieved by a method of forming a coating layer having plasma resistance, the method comprising steps of: preparing a substrate by placing the substrate in a substrate fixing device inside a process chamber; evaporating a $Y_2O_3$ deposition material provided in a solid form in an electron beam source by irradiating an electron beam on the $Y_2O_3$ deposition material; generating radical particles having activation energy by injecting a process gas containing oxygen for forming radicals into a RF energy beam source; irradiating an RF energy beam including the radical particles generated in the RF energy beam source, toward the substrate; depositing a thin film in which the evaporated deposition material is deposited on the substrate by being assisted by the RF energy beam, and densifying the thin film in which the deposition material deposited on the substrate forms a densified film by ion bombardment of the RF energy beam.

Here, it is desired to further comprise a step of setting a process variable of the RF energy beam source, prior to the step of irradiating the RF energy beam.

In addition, it is desired that the step of setting the process variable is a step of adjusting a property of the coating layer by controlling an ion current density (μA/cm2) and ion acceleration energy (eV) irradiated into the substrate, which are process variables of the RF energy beam source.

In addition, it is desired that the ion current density is set to 50 to 200 $\mu A/cm^2$, and the ion acceleration energy is set to 800 to 1,500 eV.

In addition, it is desired that in the step of generating radical particles, the process gas further includes argon.

In addition, it is desired to further comprise a step of reaction in which $Y_2O_3$ deposition particles in a gas phase and the oxygen radical particles react in an ion atmosphere formed between the RF energy beam source and the substrate, and $Y_2O_3$ deposition particles having a modified atomic ratio are generated, prior to the step of depositing the thin film.

In addition, it is desired to further comprise a step of irradiating the deposition material in which the evaporated deposition material is irradiated toward the substrate by opening a shutter of the electron beam source, after the step of irradiating the RF energy beam.

Technical Effects of the Invention

The present invention provides a method of forming a coating layer having plasma resistance, and more particularly, to a method of forming a coating layer having plasma resistance that generates oxygen and argon radicals having high activation energy by using an RF energy beam source capable of generating high-density plasma, irradiates it to a substrate, and deposits a dense coating layer with no micropores therein using high energy ion bombardment by the RF energy beam source, thereby allowing minimizing physical etching by physical sputtering, minimizing micropores inside the coating layer to minimize a contact area with chemical etching gas, and minimizing chemical etching and generation of particles.

DESCRIPTION OF REFERENCE NUMBER

110: process chamber, 120: substrate, 130: electron beam source,
131: crucible, 132: electron gun, 140: RF energy beam source,
141: plasma chamber, 142: gas supply unit, 143: RF antenna,
144: RF power supply unit, E: electron beam, Y: deposition material,
S110: substrate preparation step, S120: deposition material evaporation step,
S130: radical generation step, S140: process variable setting step,
S150: RF energy beam irradiation step, S160: deposition material irradiation step,
S170: reaction step, S180: thin film deposition step,
S190: thin film densification step

DETAILED DESCRIPTION

In various embodiments, components having the same configuration will be representatively described in Embodiment 1 using the same reference number, and in other Embodiments, configurations different from those in the Embodiment 1 will be described.

Hereinafter, the method of forming a coating layer having plasma resistance according to the Embodiment 1 of the present invention will be described in detail in conjunction with the accompanying drawings.

Figure 1:
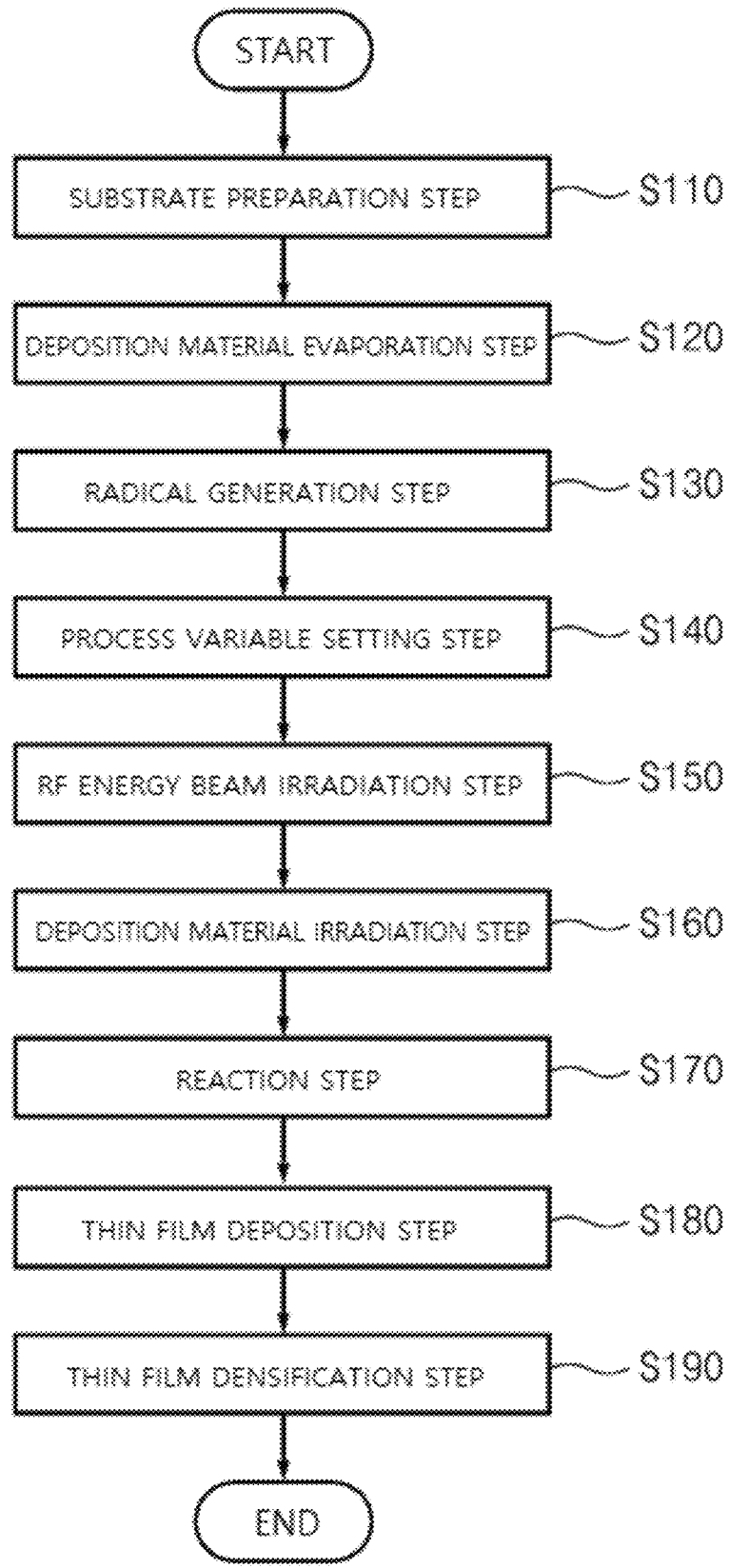
FIG. 1 is a process flowchart of a method of forming a coating layer having plasma resistance according to the present invention.
Figure 2:
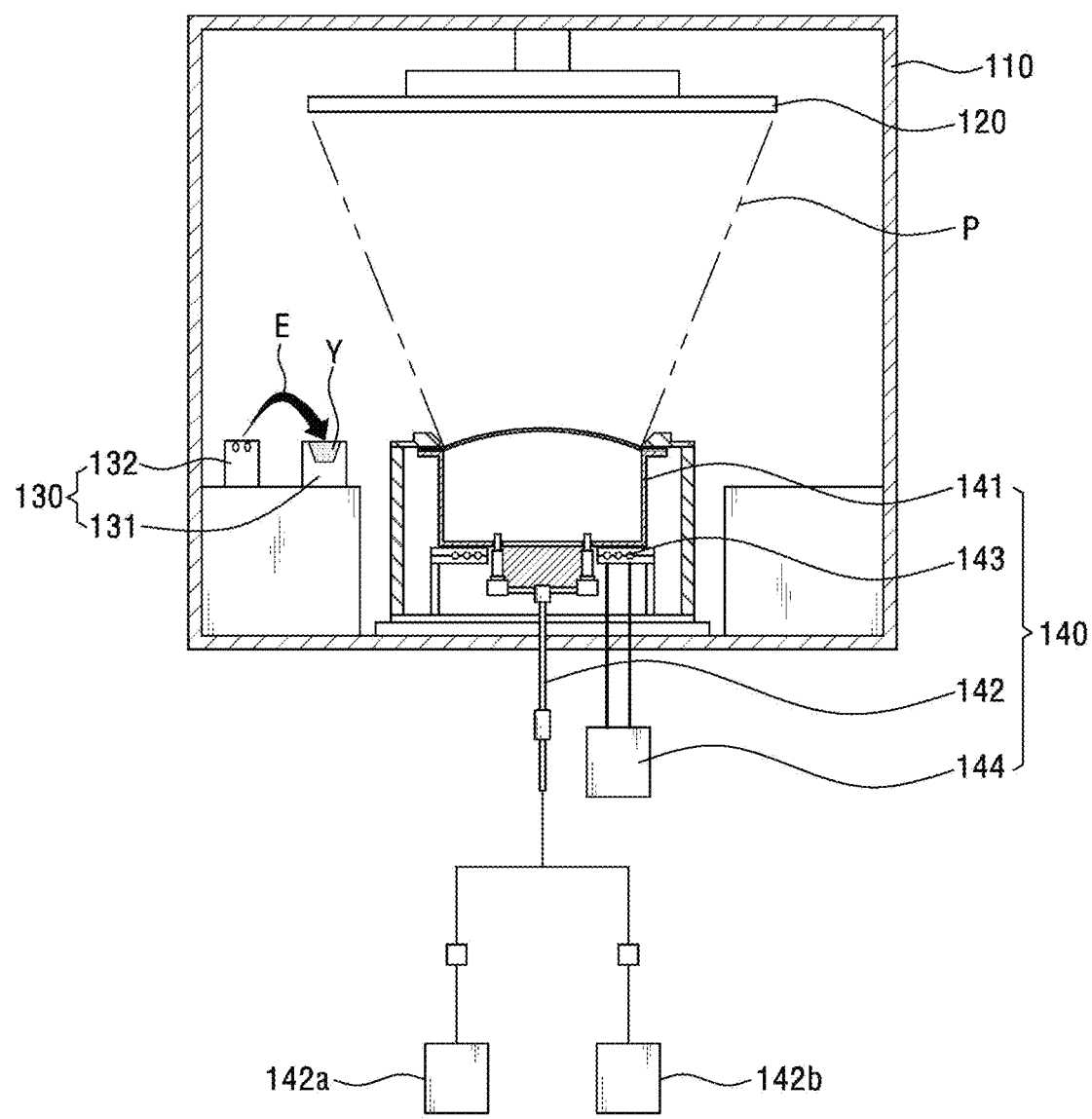
FIG. 2 is a schematic configuration diagram illustrating a deposition equipment used in the method of forming a coating layer having plasma resistance according to the present invention.
Figure 3:
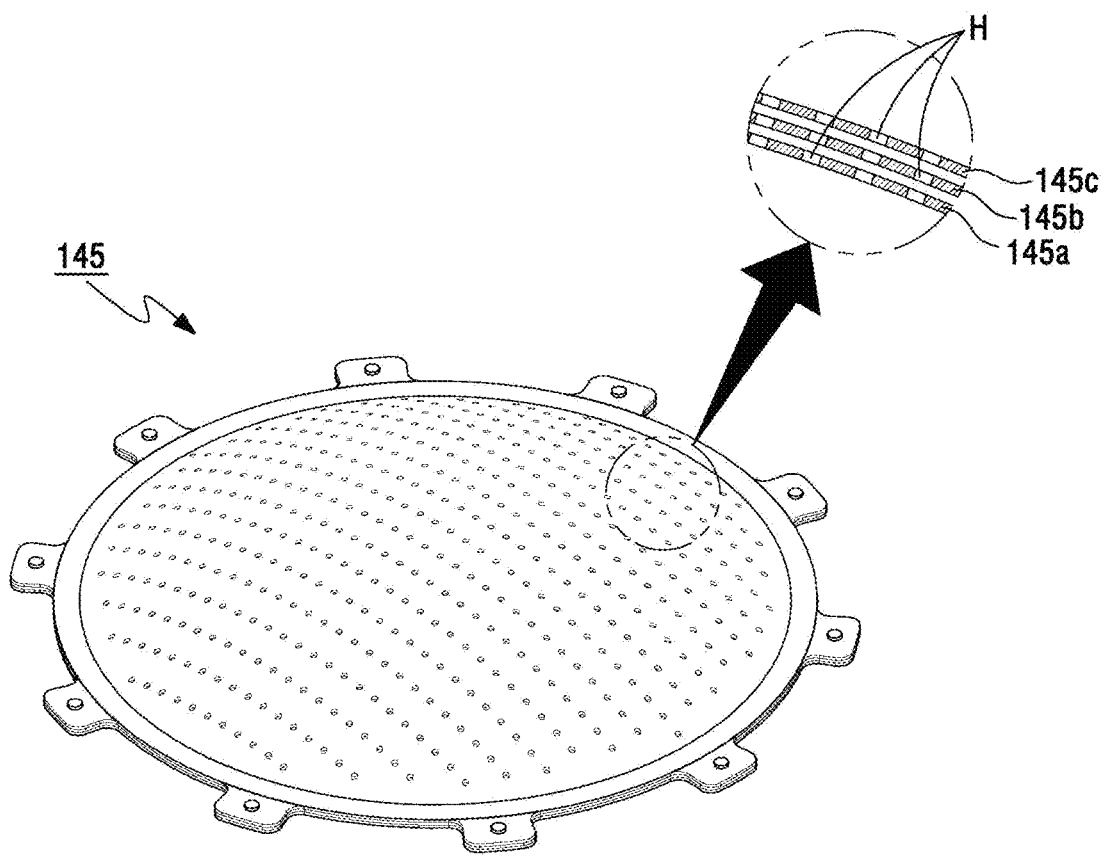
FIG. 3 is a perspective view of a grid electrode illustrated in FIG. 2.

FIG. 1 is a process flowchart of a method of forming a coating layer having plasma resistance according to the present invention. FIG. 2 is a schematic configuration diagram illustrating a deposition equipment used in the method of forming a coating layer having plasma resistance according to the present invention.

As shown in FIG. 2, the deposition equipment used in the method of forming a coating layer having plasma resistance of the present invention includes a process chamber 110, a substrate 120, an electron beam source 130, and a RF energy beam source 140.

The process chamber 110 provides a processing space sealed from the outside and may include: a door capable of opening and closing the processing space; a vacuum pump that maintains the processing space in a predetermined vacuum state suitable for the processes and that discharges reaction by-products generated during the process procedure to the outside, and a substrate fixing unit capable of fixing the substrate 120 on an upper portion of an inside of the process chamber 110.

The substrate 120 is disposed on the upper portion of the inside of the process chamber 110 for surface coating and may be fixed to the rotatable substrate fixing unit inside the process chamber 110. The substrate 120 may be a dielectric window capable of transferring energy of radio frequency (hereinafter referred to as 'RF') of an Inductive Coupled Plasma (ICP) coil to the inside of the process chamber 110 in the plasma etching equipment and may be made of a material such as alumina ($Al_2O_2$), quartz, or the like.

The electron beam source 130 vaporizes a deposition material Y to provide deposition particles in a gas phase for coating a surface of the substrate 120 and includes: a crucible 131 for accommodating the deposition material Y; an electron gun 132 for evaporating the deposition material Y using an electron beam E to form deposition particles in a gas phase for coating the surface of the substrate 120, and a shutter (not shown) capable of opening and closing an opening of an upper portion of the crucible 131.

The crucible 131 accommodates the deposition material Y for coating the surface of the substrate 120 and is disposed in a lower portion of the inside of the process chamber 110. The deposition material Y may be made of a material having excellent corrosion resistance to plasma. Specifically, the deposition material Y may be made of yttrium oxide (Yttrium oxide, Yttria, hereinafter referred to as '$Y_2O_3$').

The electron gun 132 evaporates, or vaporizes, the deposition material Y using an electron beam E to form deposition particles in a gas phase and may include a filament for emitting hot electrons. The electron gun 132 is operated to radiate the electron beam E focused by magnetic flux toward the deposition material Y accommodated in the crucible 131 as indicated by an arrow in FIG. 2.

The RF energy beam source 140 provides an RF energy beam P toward the substrate 120 inside the process chamber 110 in order to assist coating the deposition material Y. The RF energy beam source 140 includes: a plasma chamber 141 in which a plasma generating space is provided and one side of which is opened toward the substrate 120; a gas supply unit 142 supplying process gases such as oxygen (O2) and argon (Ar) to the plasma generating space; an RF antenna 143 disposed on an outer surface of the plasma chamber 141 to generate plasma inside the plasma chamber 141; an RF power supply unit 144 applying RF power to the RF antenna 143, and a grid electrode 145 that closes the opening of the plasma chamber 141 and has a plurality of through holes H for passing ions on a plate surface.

Here, the gas supply unit 142 may include an oxygen gas storage tank 142a and an argon gas storage tank 142b respectively connected to the plasma chamber 141 through pipes. In this case, each of a pipe for connecting to the oxygen gas storage tank 142a and a pipe for connecting to the argon gas storage tank 142b may be provided with a control valve capable of controlling a mixing ratio of oxygen and argon by adjusting a gas supply amount.

In addition, the grid electrodes 145 are sequentially arranged from the plasma generating space toward a processing space of the process chamber 110 and includes a first electrode 145a, a second electrode 145b, and a third electrode 145c, which are electrically insulated from each other. That is, the first electrode 145a is disposed in contact with the plasma generating space, the third electrode 145c is disposed in contact with the processing space of the process chamber 110, the third electrode 145b is disposed in contact with processing space of the process chamber 110, and the second electrode 145b is disposed between the first electrode 145a and the third electrode 145c. A voltage source is respectively connected to each of the first electrode 145a and the second electrode 145b. A positive voltage is applied to the first electrode 145a, and a negative voltage is applied to the second electrode 145b. Accordingly, a potential difference for accelerating ions is generated between the first electrode 145a and the second electrode 145b. The third electrode 145c is electrically grounded. By controlling the potential difference between the second electrode 145b and the third electrode 145c, a diameter of the RF energy beam P can be controlled within a predetermined numerical range based on an electrostatic lens effect.

The method of forming a coating layer having plasma resistance of the present invention is to form a coating layer having plasma resistance on the surface of the substrate 120 using the deposition equipment as described above. As shown in FIG. 1, the method of forming a coating layer having plasma resistance comprises: a substrate preparation step S110, a deposition material evaporation step S120, a radical generation step S130, a process variable setting step S140, an RF energy beam irradiation step S150, a deposition material irradiation step S160, a reaction step S170, a thin film deposition step S180, and a thin film densification step S190.

In the substrate preparation step S110, the substrate 120 is disposed on the upper portion of the inside of the process chamber 110.

In the deposition material evaporation step S120, $Y_2O_3$ deposition particles in a gas phase are provided by using the electron beam source 130 disposed inside the process chamber 110.

In the radical generating step S130, radical particles having high activation energy are generated using the RF energy beam source 140 disposed inside the process chamber 110. A process gas containing oxygen is supplied to the plasma generation space of the RF energy beam source 140 using the gas supply unit 142, and then RF power is applied to the RF antenna 143 through the RF power supply unit 144. By allowing a high frequency to be applied to the inside of the plasma chamber 141, oxygen is dissociated into radicals.

Meanwhile, in the radical generating step S130, oxygen and argon radicals having high activation energy can be generated by adding argon to the process gas according to a desired property of the coating layer. When argon is additionally supplied, since atomic weight of argon is higher and heavier than oxygen, argon may be helpful to increase density and surface roughness of the coating layer in the thin film densification step S190.

In the process variable setting step S140, by controlling the RF power applied to the RF antenna 143 through the RF power supply unit 144, an ion current density ($\mu A/cm^2$) and ion acceleration energy (eV) of the energy beam P emitted from the plasma chamber 141 can be controlled.

That is, since hardness (Hv) and surface roughness ($\mu m$) of the coating layer are determined by the ion current density ($\mu A/cm^2$) and ion acceleration energy (eV) of an energy beam P, and the ion current density and the ion acceleration energy of the energy beam P are determined by characteristics of the RF power applied to the RF antenna 143, properties of the coating layer can be adjusted by controlling the RF power of the RF power supply 144 in the process variable setting step S140 according to a purpose or characteristic of the substrate 120. In this case, the ion current density incident on the substrate 120 may be set to 50 to 200 $\mu A/cm^2$, and the ion acceleration energy (eV) may be set to 800 to 1,500 eV.

Specifically, when the ion current density is less than 50 $\mu A/cm^2$, densification effect of the coating layer is significantly lowered and forms a columnar crystal structure, and thus, hardness and surface roughness of the coating layer are poor. When the ion current density exceeds 200 $\mu A/cm^2$, as the densification of the coating layer is made more than necessary, a crack occurs in the coating layer, or adhesion between the coating layer and the substrate 120 is lowered, thereby causing problems such as peeling of the coating layer.

Similarly, when the ion acceleration energy is less than 800 eV, densification effect of the coating layer is significantly lowered and forms a columnar crystal structure. Accordingly, the hardness and surface roughness of the coating layer become poor. When the ion acceleration energy exceeds 1,500 eV, the hardness of the coating layer becomes higher than necessary, thereby causing the coating layer to be easily broken or peeled off the substrate 120.

In the RF energy beam irradiation step S150, characteristics of the voltage applied to the grid electrode 145 of the RF energy beam source 140 are controlled, and through the radical generating step S130, radical particles dissociated in the plasma generating space may be emitted toward the substrate 120.

When a positive voltage is applied to the first electrode 145a of the grid electrode 145, a negative voltage is applied to the second electrode 145b, and the third electrode 145c is grounded, as a potential difference for accelerating ions is generated between the first electrode 145a and the second electrode 145b, radical particles and ions in the plasma generating space may be emitted in a beam form toward the substrate 120. In this case, a diameter of the RF energy beam P can be adjusted by controlling a potential difference between the second electrode 145b and the third electrode 145c.

That is, the grid electrode 145 disposed in the opening of the plasma chamber 141 of the RF energy beam source 140 accelerates ions included in the plasma in a process of emitting the ions through the through hole H of the grid electrode 145, and thus, the ions may be provided to the substrate 120 with approximately 1,000 eV. Accordingly, since deposition particles are deposited on the surface of the substrate 120 by being assisted by the RF energy beam P having relatively higher energy than an electron beam or plasma beam, deposition density of the coating layer can be further improved.

In the deposition material irradiation step S160, by opening the shutter of the electron beam source 130, evaporated deposition particles may be emitted to be provided toward the substrate 120. The deposition material irradiation step S160 is performed in a state in which the RF energy beam is irradiated toward the substrate 120 through the RF energy beam irradiation step S150.

In the reaction step S170, as $Y_2O_3$ deposition particles in a gas phase and oxygen radicals combine in an ionic atmosphere with a high activation state, and the $Y_2O_3$ deposition particles are doped with oxygen or oxidized, deposition particles having a modified atomic ratio can be formed through reaction equation of $Y_2O_3+O_2=Y_{(2\pm x)}O_{(3\pm y)}$ (x=0~0.5, y=0~0.5).

In particular, since this reaction is performed in the ionic atmosphere with a high activation state, the $Y_2O_3$ deposition particles, which are difficult to be formed in a general environment, can be easily synthesized with various atomic ratios. A composition ratio of the $Y_2O_3$ deposition particles can be adjusted by oxygen concentration of the supply gas supplied to the plasma generation space, and thus $Y_2O_3$ deposition particles having a desired composition ratio can be easily synthesized.

In the thin film deposition step S180, the deposition particles formed in the reaction step S170 are assisted by the RF energy beam P having high energy and are deposited on the surface of the substrate 120 to form the coating layer.

In the thin film densification step S190, as the coating layer deposited on the surface of the substrate 120 through the thin film deposition step S180 is under ion bombardment by the energy beam P having high acceleration energy, the structure becomes densified and forms a high-density film with excellent quality, and thus, the hardness and surface roughness of the coating layer can be improved.

Meanwhile, in the thin film densification step S190, by rapidly increasing a surface temperature of the coating layer and then cooling it rapidly like Rapid Thermal Process (RTP) used in a semiconductor process, the density of the coating layer is further increased, and thus, the physical properties of the coating layer can be further improved.

Hereinafter, the present invention will be described in more detail through embodiments. However, these embodiments are for illustrative purposes only, and the scope of the present invention is not limited to these embodiments.

Embodiments 1 to 4

According to the Embodiment 1, a polished sample is mounted on a substrate fixing unit provided inside the process chamber 110 of the deposition equipment, and power is applied to the electron beam source 130 to generate an electron beam E by increasing current up to 500 mA. Accordingly, the $Y_2O_3$ deposition material is melted by the electron beam E current. The rotation speed of the substrate fixing unit is maintained at about 20 rpm. A process gas for forming radicals of oxygen and argon is injected into the RF energy beam source 140, and an RF energy beam is formed. The RF power is controlled so that the current density of the RF energy beam could be maintained at 120 μA/cm² or more, and the ion acceleration energy is maintained at 1,000 eV or more. A shutter, the grid electrode, of the RF energy beam source 140 is opened to irradiate the RF energy beam P to the substrate 120, and then, a shutter of the electron beam source 130 is opened to deposit $Y_2O_3$ deposition particles on the surface of the substrate 120. In a process of scattering $Y_2O_3$ deposition particles to the substrate 120 to reach the substrate 120, a dense $Y_2O_3$ coating layer is deposited on the surface of the substrate 120 through chemical and physical interactions between the $Y_2O_3$ deposition particles and oxygen and argon radicals included in the RF energy beam P. In this process, the growth of the $Y_2O_3$ coating layer is compacted by strong ion bombardment and forms a dense film.

In addition, in the Embodiment 2, the ion current density is maintained at 120 μA/cm 2, and the ion acceleration energy is maintained at 1,000 eV. In the Embodiment 3, the ion current density is maintained at 90 μA/cm 2, and the ion acceleration energy is maintained at 1,000 eV. In the Embodiment 4, the ion current density is maintained at 50 μA/cm 2, and the ion acceleration energy is maintained at 1,000 eV. In each case, oxygen is injected as reactive gas.

In a coating layer formed in the Embodiment 1, hardness is 1,350 Hv or more, and surface roughness is 0.014 μm. In a coating layer formed in the Embodiment 2, hardness is 1,250 Hv or more, and surface roughness is 0.018 μm. In a coating layer formed in the Embodiment 3, hardness is 1,000 Hv or more, and surface roughness is 0.020 μm. In a coating layer formed in the Embodiment 4, hardness is 600 Hv or more, and surface roughness is 0.022 μm. That is, the hardness and surface roughness of the coating layer have a tendency to be linearly proportional to the ion current density.

Comparative Example 1

According to Comparative Example 1, a polished sample is mounted on the substrate fixing unit provided inside the process chamber 110 of the deposition equipment, and power is applied to the electron beam source 130 to generate an electron beam E by increasing the current up to 500 mA. Accordingly, the $Y_2O_3$ deposition material is melted by the electron beam E current. The rotation speed of the substrate

TABLE 1

| Embodiment | Ion electric current density (μA/cm²) | Ion acceleration energy (eV) | Radical gas | Deposition material | Hardness (Hv) | Surface roughness (μm) | Plasma source |
|---|---|---|---|---|---|---|---|
| Embodiment 1 | >120 | >1,000 | $O_2$, Ar | $Y_2O_3$ | 1,350 | 0.014 | RF energy beam source |
| Embodiment 2 | >120 | >1,000 | $O_2$ | $Y_2O_3$ | 1,250 | 0.018 | |
| Embodiment 3 | >90 | >1,000 | $O_2$ | $Y_2O_3$ | 1,000 | 0.020 | |
| Embodiment 4 | >50 | >1,000 | $O_2$ | $Y_2O_3$ | 600 | 0.022 | |
| Comparative example 1 | >100 | >150 | $O_2$ | $Y_2O_3$ | 270 | 0.18 | DC end hall source | fixing unit is maintained at about 20 rpm. A reactive gas for forming radicals of oxygen and argon is injected into a DC End Hall Source, and a radical beam is formed. An anode DC voltage is adjusted so that the current density of radical ions could be maintained at 100 µA/cm² or more, and the ion acceleration energy is maintained at 150 eV or more. A shutter of the DC energy beam source is opened to irradiate the DC energy beam to the substrate 120, and then, the shutter of the electron beam source 130 is opened to deposit $Y_2O_3$ on the surface of the substrate 120. In a process of scattering $Y_2O_3$ deposition particles to the substrate 120 to reach the substrate 120, a $Y_2O_3$ material is deposited on the surface of the substrate 120 through chemical and physical interactions between the $Y_2O_3$ deposition particles and oxygen and argon radicals included in the DC energy beam. In this process, the growth of the $Y_2O_3$ coating layer is compacted by ion bombardment and forms a coating layer.

Since the coating layer formed in Comparative Example 1 is deposited through support of the DC energy beam having relatively low energy compared to the RF energy beam, the coating layer goes through a relatively low densification process compared to the Embodiments 1 to 4 in which the RF energy beam is provided, and accordingly, it shows lower hardness (270 Hv) and higher surface roughness (0.18 µm) compared to Embodiments 1 to 4.

Figure 4:
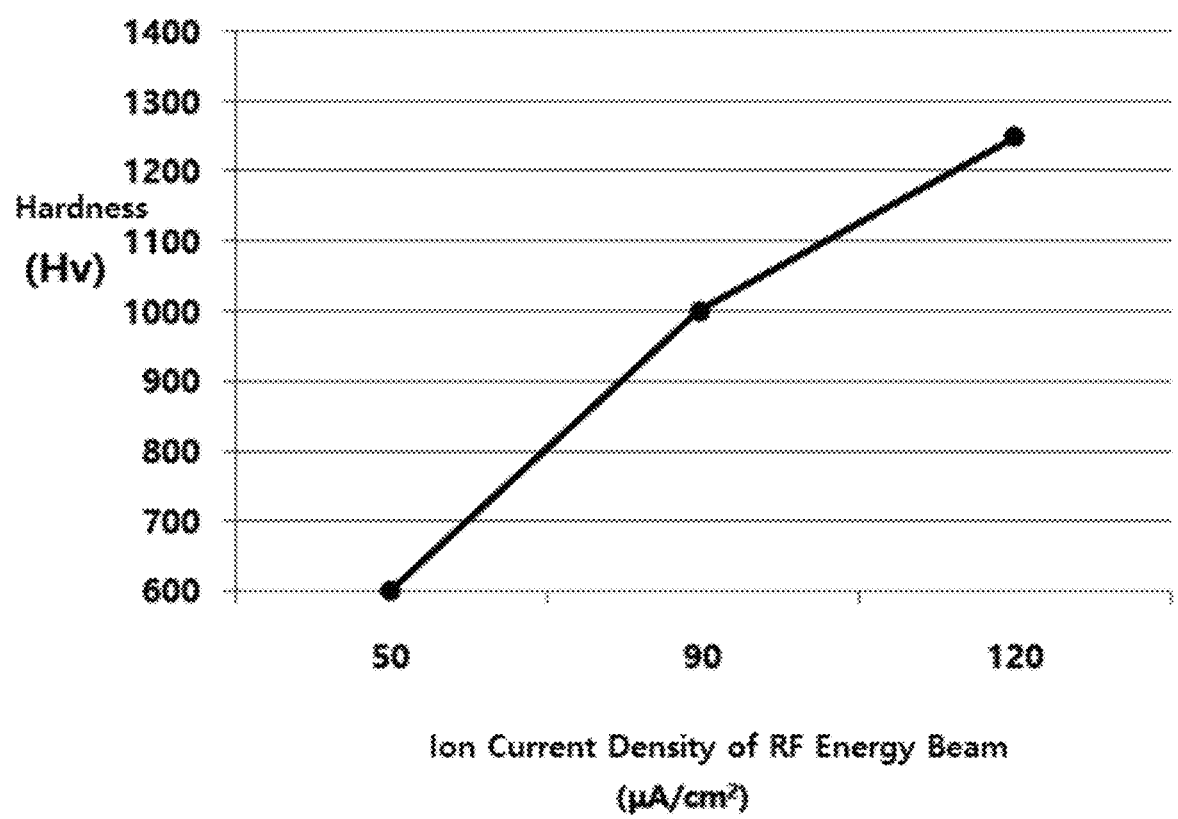
FIG. 4 is a graph illustrating a relationship between ion current density of a RF energy beam and hardness of a coating layer according to the present invention.

As the ion current density of the RF energy beam irradiated to the substrate increases during the deposition of the $Y_2O_3$ coating layer, the hardness of the coating layer tends to increase as shown in FIG. 4. As the ion current density of the RF energy beam increases, the degree of ion bombardment of the growing $Y_2O_3$ coating layer increases, leading to a tendency to increase the density of the coating layer and increase the hardness.

Figure 5:
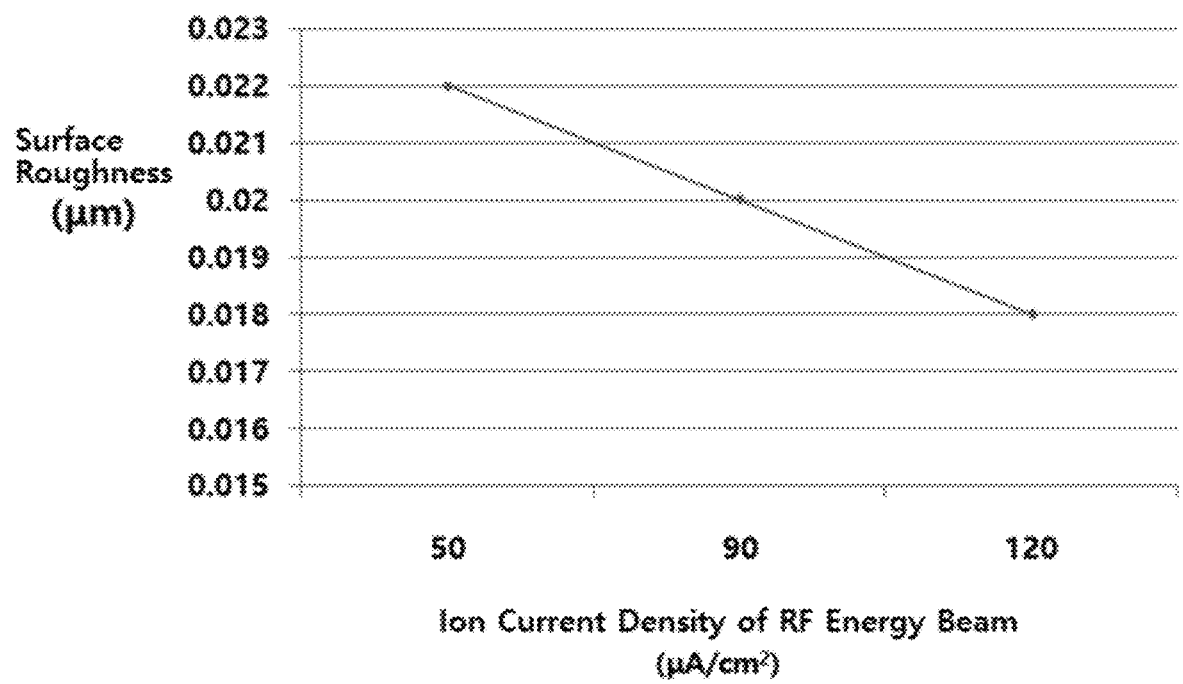
FIG. 5 is a graph illustrating a relationship between ion current density of the RF energy beam and surface roughness of a coating layer according to the present invention.

In addition, as the ion current density of the RF energy beam irradiated to the substrate increases during the deposition of the $Y_2O_3$ coating layer, the surface roughness of the coating layer decreases as shown in FIG. 5 and tends to have a more uniform and flat surface. This is because, as the ion current density of the RF energy beam P increases, the degree of ion bombardment to the growing $Y_2O_3$ coating layer increases, thereby improving mobility of the deposition particles of the growing $Y_2O_3$ coating layer and thus leading to a tendency in which the surface is smoother, and the surface roughness is lowered.

Figure 6A:
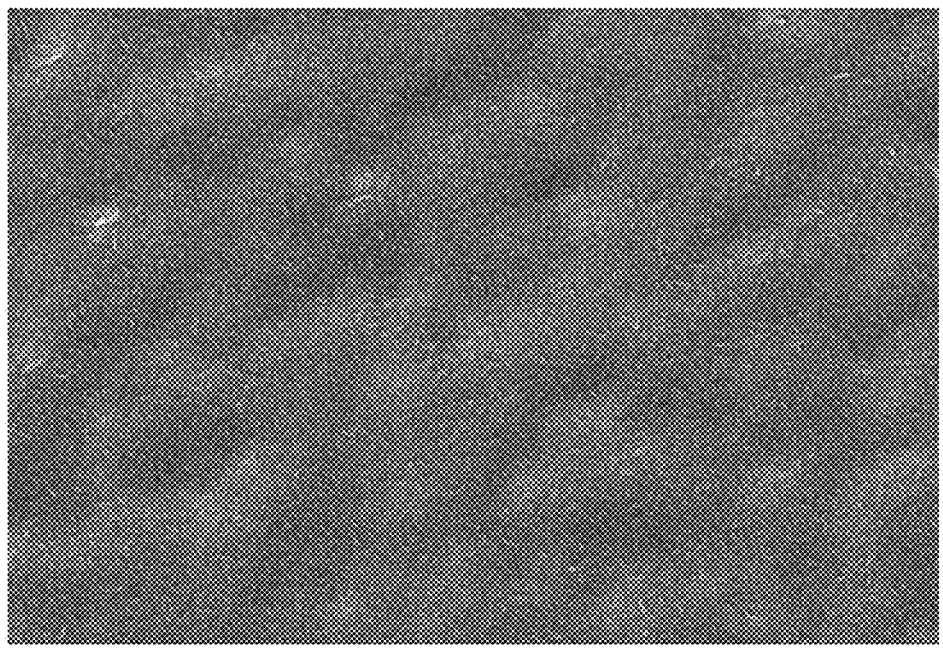
FIGS. 6A and 6B are SEM surface photographs of Embodiment 1 of the present invention and Comparative Example 1, respectively.
Figure 6B:
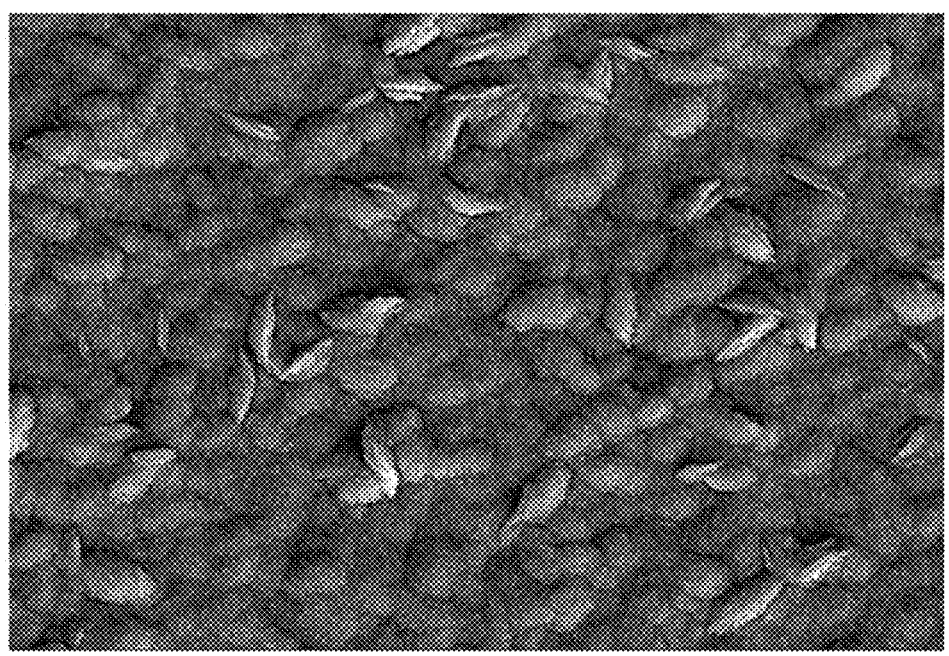
Figure 7A:
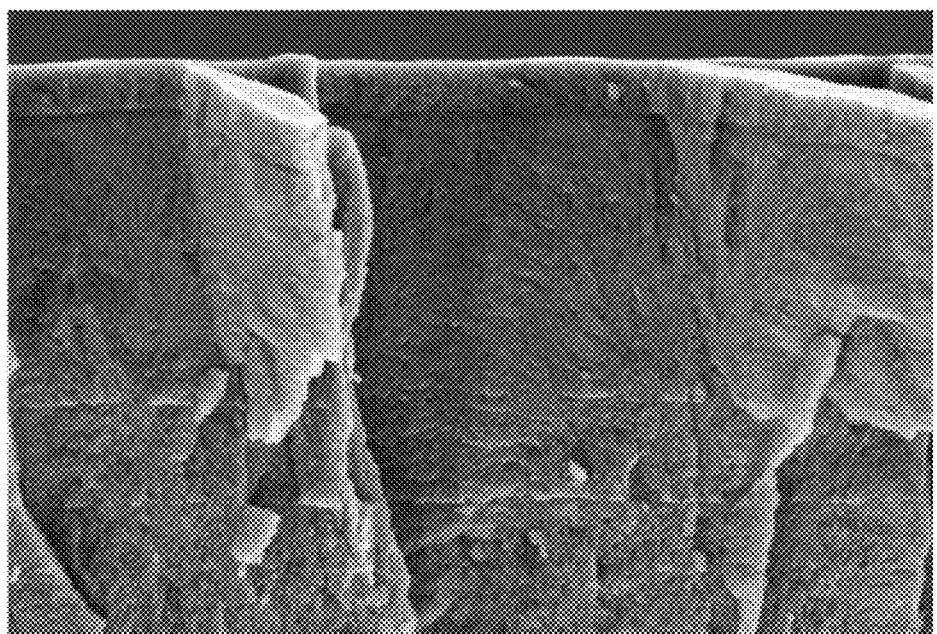
FIGS. 7A and 7B are SEM cross section photographs of the Embodiment 1 of the present invention and the Comparative Example 1, respectively.
Figure 7B:
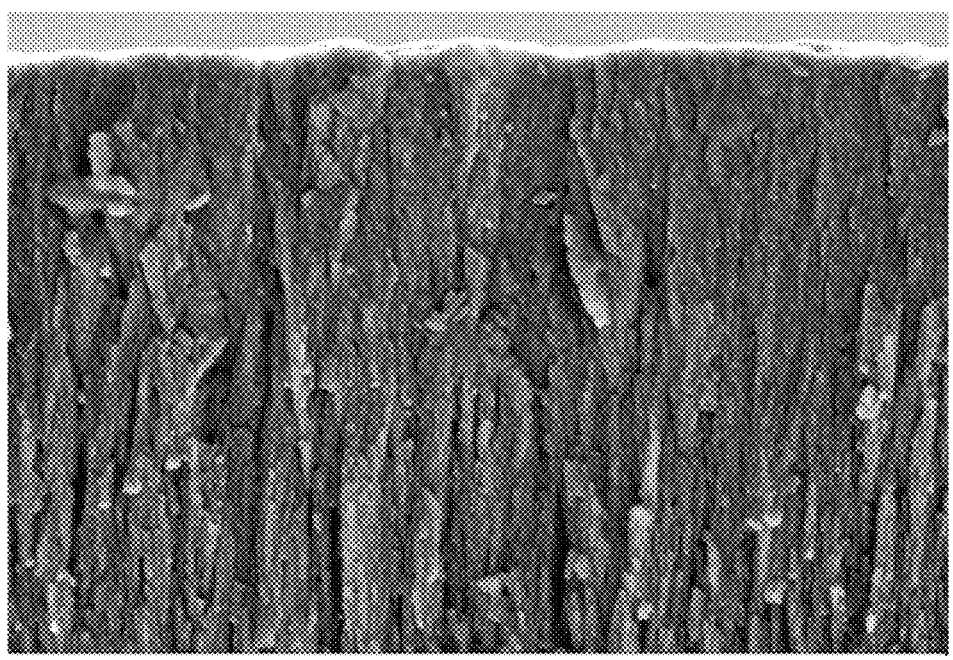

FIGS. 6A and 6B are SEM surface photographs of the Embodiment 1 of the present invention and Comparative Example 1, respectively. FIGS. 7A and 7B are SEM cross section photographs of the Embodiment 1 of the present invention and the Comparative Example 1, respectively.

FIG. 6A is a Scanning Electron Microscope (SEM) photograph showing a surface of the $Y_2O_3$ coating layer deposited in the Embodiment 1, and FIG. 6B is a SEM photograph showing a surface of the $Y_2O_3$ coating layer deposited in the Comparative Example 1. As shown in FIGS. 6A and 6B, in the case of the Embodiment 1 in which the ion current density of the RF energy beam irradiated to the substrate 120 is relatively high during the deposition of the $Y_2O_3$ coating layer, the SEM surface photograph shows that a surface shape is smoother and has low surface roughness, whereas in the case of the Comparative Example 1, the SEM surface photograph shows that a surface shape of the coating layer has protrusions of columnar structures.

In addition, FIG. 7A is a SEM photograph showing a cross section of the $Y_2O_3$ coating layer deposited in the Embodiment 1, and FIG. 7B is a SEM photograph showing a cross section of the $Y_2O_3$ coating layer deposited in the Comparative Example 1. As shown in FIGS. 7A and 7B, in the case of the Embodiment 1 in which the ion current density of the RF energy beam irradiated to the substrate 120 is relatively high during the deposition of the $Y_2O_3$ coating layer, the SEM cross section photograph shows that a shape of a cross section of the coating layer has a dense structure, whereas in the case of the Comparative Example 1, the SEM cross section photograph shows that a shape of a cross section of the coating layer has protrusions of columnar structures.

As describe above, the present invention can deposit a dense coating layer with no micropores therein using high energy ion bombardment by the RF energy beam source, thereby minimizing physical etching by physical sputtering, minimizing micropores inside the coating layer to minimize a contact area with chemical etching gas, and minimizing chemical etching and generation of particles.

The scope of the present invention is not limited to the embodiments described above but may be implemented in various forms of embodiments within the scope of the appended claims. In addition, it is considered to be within the scope of the claims of the present invention to the various extents that can be modified without departing from the gist of the present invention in the claims, by those of ordinary skill in the art to which the invention pertains.

What is claimed is:

1. A method of forming a coating layer having plasma resistance, the method comprising steps of:
    preparing a substrate by placing the substrate in a substrate fixing device inside a process chamber;
    evaporating a $Y_2O_3$ deposition material provided in a solid form in an electron beam source by irradiating an electron beam on the $Y_2O_3$ deposition material;
    generating radical particles having activation energy by injecting a process gas containing oxygen for forming radicals into a RF energy beam source;
    setting a process variable of the RF energy beam source;
    irradiating an RF energy beam including the radical particles generated in the RF energy beam source, toward the substrate;
    reaction in which $Y_2O_3$ deposition particles in a gas phase and the oxygen radical particles react in an ion atmosphere formed between the RF energy beam source and the substrate, and $Y_2O_3$ deposition particles having a modified atomic ratio are generated;
    depositing a thin film in which the evaporated deposition material is deposited on the substrate by being assisted by the RF energy beam;
    densifying the thin film in which the deposition material deposited on the substrate forms a densified film by ion bombardment of the RF energy beam; and
    wherein the step of setting the process variable comprises adjusting hardness and surface roughness of the coating layer by controlling an ion current density (µA/cm²) and ion acceleration energy (eV), which are process variables of the RF energy beam source and irradiated into the substrate.

2. The method of forming a coating layer of claim 1, wherein the ion current density is set to 50 to 200 µA/cm², and the ion acceleration energy is set to 800 to 1,500 eV.

3. The method of forming a coating layer of claim 1, wherein in the step of generating radical particles, the process gas further includes argon.

4. The method of forming a coating layer of claim 1, further comprising a step of irradiating the deposition material in which the evaporated deposition material is irradiated toward the substrate by opening a shutter of the electron beam source, after the step of irradiating the RF energy beam.

* * * * *